US009724255B2

(12) United States Patent
Hollyoak et al.

(10) Patent No.: US 9,724,255 B2
(45) Date of Patent: Aug. 8, 2017

(54) HOSPITAL BED SENSOR SYSTEM (71) Applicant: HUNTLEIGH TECHNOLOGY LIMITED, Dunstable (GB)

(72) Inventors: Stephen Hollyoak, Kingswinford (GB); Robert Hugh Jones, Tipton (GB)

(73) Assignee: Huntleigh Technology Limited (GB)

( * ) Notice: Subject to any disclaimer, the term of this patent is extended or adjusted under 35 U.S.C. 154(b) by 0 days.

(21) Appl. No.: 14/415,575

(22) PCT Filed: Jul. 4, 2013

(86) PCT No.: PCT/GB2013/051772
§ 371 (c)(1),
(2) Date: Jan. 16, 2015

(87) PCT Pub. No.: WO2014/013221
PCT Pub. Date: Jan. 23, 2014

(65) Prior Publication Data
US 2015/0128346 A1 May 14, 2015

(30) Foreign Application Priority Data
Jul. 18, 2012 (GB) .................................. 1212765.0

(51) Int. Cl.
*B60B 33/00* (2006.01)
*A61G 7/05* (2006.01)
(Continued)

(52) U.S. Cl.
CPC ............... *A61G 7/05* (2013.01); *A61G 7/052* (2016.11); *A61G 7/0507* (2013.01);
(Continued)

(58) Field of Classification Search
CPC .................................................. B60B 33/00
(Continued)

(56) References Cited

U.S. PATENT DOCUMENTS 5,611,638 A 3/1997 Dorr et al.
5,699,038 A 12/1997 Ulrich et al.
(Continued)

FOREIGN PATENT DOCUMENTS

DK WO 2013071932 A1 * 5/2013 ......... B60B 33/0092
EP 2 030 602 A2 3/2009
GB 2292311 A 2/1996

OTHER PUBLICATIONS

International Search Report issued for corresponding International Patent Application No. PCT/GB2013/051772, dated Oct. 21, 2013, 3 pages.

*Primary Examiner* — Fredrick Conley
(74) *Attorney, Agent, or Firm* — The Webb Law Firm (57) ABSTRACT

A first embodiment provides a manually operable castor assembly for a hospital bed, including a wheel unit fittable to a bed frame and provided with a lock actuator. A sensor unit is provided with a trigger element and a sensor element, the trigger element being located on the manually operable brake actuator and the sensor element being located on the wheel unit. Another embodiment provides a manually operable safety side panel assembly including a hinge assembly coupled to the panel element and attachable to a bed frame, and a sensor unit including a trigger element and a sensor element, the trigger element being located on the manually operable actuator and the sensor element being located on a part of the side panel or hinge assembly. Monitoring apparatus monitors the manually operable bed safety device and including a control unit coupled to the sensor unit and an indicator unit controllable by the control unit and operable to give an indication of the state of the device.

18 Claims, 8 Drawing Sheets

(51) Int. Cl.
 *B60B 33/02* (2006.01)
 *G01R 33/07* (2006.01)
 *H03K 17/95* (2006.01)
(52) U.S. Cl.
 CPC .......... *A61G 7/0509* (2016.11); *A61G 7/0528* (2016.11); *B60B 33/02* (2013.01); *G01R 33/07* (2013.01); *H03K 17/9517* (2013.01); *A61G 2203/36* (2013.01); *H03K 2217/95* (2013.01)
(58) Field of Classification Search
 USPC ........................................ 5/600; 188/1.12, 4
 See application file for complete search history.

(56) References Cited

U.S. PATENT DOCUMENTS

| | | |
|---|---|---|
| 2002/0013965 A1 | 2/2002 | Wilson et al. |
| 2002/0059679 A1 | 5/2002 | Weismiller et al. |
| 2003/0102172 A1 | 6/2003 | Kummer et al. |
| 2004/0177443 A1 | 9/2004 | Simmonds et al. |
| 2008/0010748 A1 | 1/2008 | Menkedick et al. |
| 2010/0077548 A1 | 4/2010 | Genske et al. |
| 2011/0120815 A1* | 5/2011 | Frolik .................... A61G 7/018 188/1.12 |

* cited by examiner

UN-Braked Position

Fig. 6b

Braked Position

HOSPITAL BED SENSOR SYSTEM

CROSS-REFERENCE TO RELATED APPLICATIONS

This application is a nationalization under 35 U.S.C. §371 of PCT International Application No. PCT/GB2013/051772, filed Jul. 4, 2013 titled "HOSPITAL BED SENSOR SYSTEM", which in turn claims the benefit of priority to Patent Application serial No. GB1212765.0 filed on Jul. 18, 2012, the entire contents of which are expressly incorporated by reference herein.

FIELD OF THE DISCLOSURE

The present invention relates to a manually operable bed safety features and to monitoring apparatus for monitoring the state of one or more bed safety features.

BACKGROUND OF THE DISCLOSURE

Hospital beds are provided with a number of convenience and safety features including, for example, side barriers for retaining a patient safely in the bed and castors for allowing care staff to move the patient while in the bed. There are typically provided one or more brakes for locking the castors and thus the bed in position. It is generally convenient to have the side barriers and brakes manually operable, for instance for patient and care worker convenience as well as to avoid the need to have a power supply available for operation of these particular features. Manual operation can, however, lead to operator error and uncertainty as to whether these safety devices have been properly set in their safe configurations.

SUMMARY OF THE DISCLOSURE

The present invention seeks to provide a system for monitoring such features of a hospital bed.

According to an aspect of the present invention, there is provided a manually operable bed safety device for a hospital bed including a lock arranged to lock the device in a safety position, a manually operable actuator for releasing the lock and thereby releasing the safety device, a sensor unit fitted at least in part to the actuator and operable to detect whether the actuator is in a locking or a releasing condition.

This structure provides a manually operable bed safety device with means to sense the condition of the device, which in practice can avoid errors in configuration of the bed, particularly when the patient is left unattended.

In an embodiment, the device is a castor assembly including a wheel unit fittable to a bed frame and provided with a castor, the lock being a brake mounted on the castor assembly and movable between a release position allowing rotation of the castor and a locking position preventing rotation of the castor; the manually operable actuator being coupled to the brake and operable to move the brake between the release and locking positions; the sensor unit being provided with a trigger element and a sensor element, the trigger element being located on the manually operable brake actuator and the sensor device being located on the wheel unit.

The trigger device, which need not be electrically wired, is located on the movable part of the device, whereas the sensor element, which may be wired, is located on a part of the device which does not move relative to the bed frame. Thus, the sensor unit is able to be coupled readily to a control unit fitted to the bed frame without impinging upon the movement of the various elements of the bed, including the manually operable device.

In another embodiment, the device is a safety side panel assembly for a hospital bed including a panel element, a hinge assembly coupled to the panel element and attachable to a bed frame, the hinge assembly permitting movement of the panel element between a safety position and an access position; the lock being coupled to the hinge assembly for locking the hinge assembly and thereby the panel element in the safety position, the manually operable actuator being located on the side panel and connected to the lock, the sensor unit including a trigger element and a sensor element, the trigger element being located on the manually operable actuator and the sensor element being located on a part of the side panel or hinge assembly.

More generally, the sensor unit may include a trigger element and a sensor element, the trigger element being coupled to the manually operated actuator.

By locating the trigger element on and in practice integrally with, the manually movable actuator of the safety device, the trigger will reliably be moved and thus trigger the sensor unit. Advantageously, the sensor element includes no separately movable parts which depend upon cooperation with the actuator, such as a switch lever. This provides a most reliable sensor arrangement that devices which include moving sensor parts able to fail.

In the preferred embodiment, the trigger element is a magnet and the sensor element is a Hall sensor.

According to another aspect of the present invention, there is provided monitoring apparatus for monitoring a manually operable bed safety device as taught herein, including a control unit coupled to the sensor unit and an indicator unit controllable by the control unit and operable to give an indication of the state of the device.

Preferably, the control unit includes a memory and a clock and is configured to store data relating to the state of the device over a period of time. There may also be provided a report generating unit operable to provide a report of the data stored in memory. These features enable a history of the state of operation of the device to be obtained, useful in determining correct operation of the safety features of the bed and can be used both for manually operable safety devices as well as actuator operated devices.

In an embodiment, the control unit is configured to receive data from a plurality of sensor units of a plurality of associated manually operable bed safety devices and to give an indication of the state of all of the plurality of devices.

BRIEF DESCRIPTION OF THE DRAWINGS

Embodiments of the present invention are described below, by way of example only, with reference to the accompanying drawings, in which.

DESCRIPTION OF THE ILLUSTRATIVE EMBODIMENTS

Figure 1:
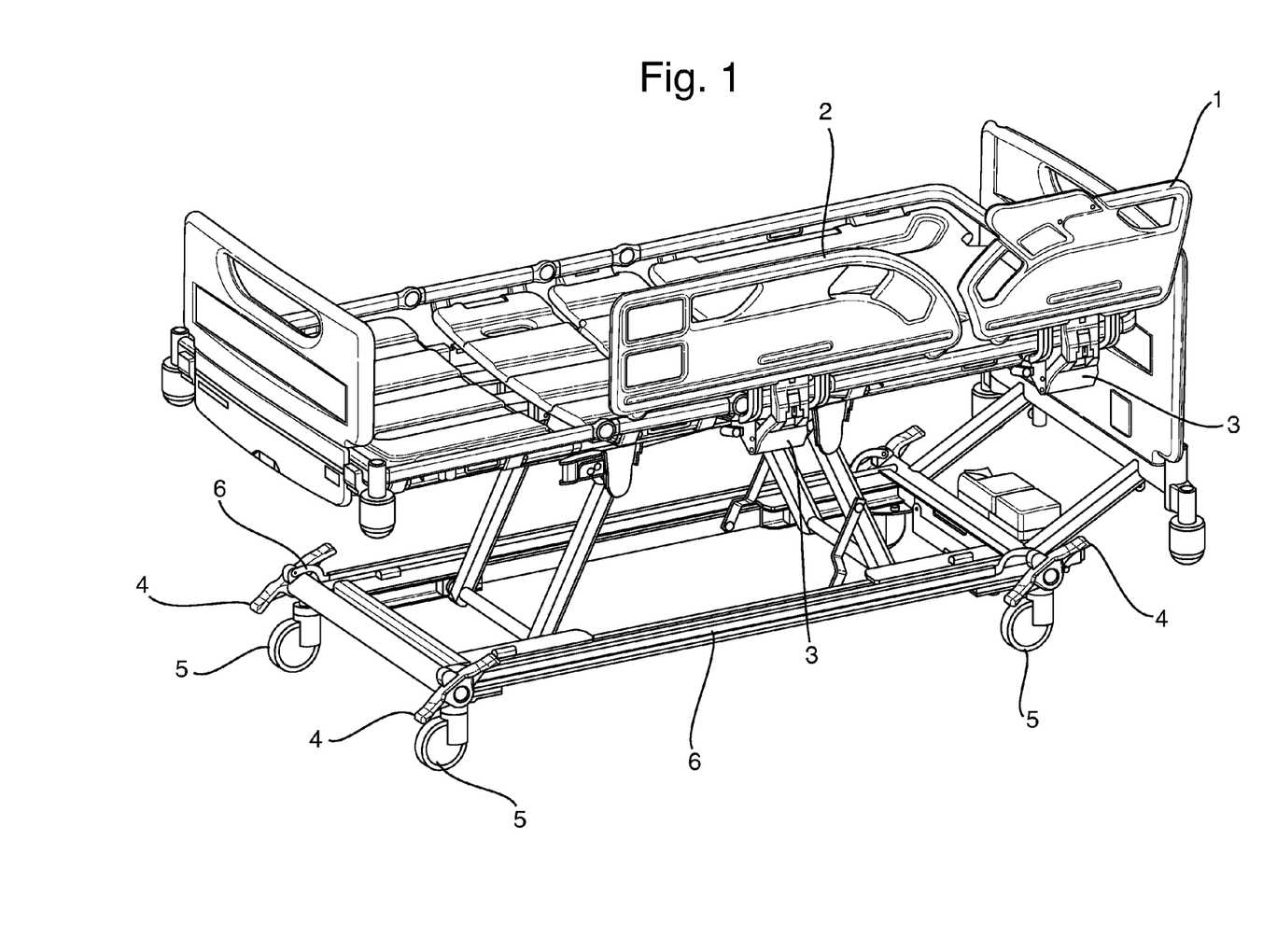
FIG. 1 shows a general arrangement of a hospital fitted with safety-sides and braking system for the castors.

Referring to FIG. 1, there is shown an example of hospital bed to which the teachings herein can be applied. The bed includes a number of movable safety devices and a raisable and lowerable platform. The principal components of relevance to the teachings herein include side panels 1 and 2, of which there are pairs on both sides of the bed, coupled to the bed platform by manually actuatable hinge assemblies 3. Castor assemblies 5 are located at either corner of bed frame 6 and are provided with manually operable brake actuators 4. The skilled person will understand that reference to manual operation includes operation by a person's foot and is intended to refer to a mechanical device rather than a powered device.

The advantage of having at least the side panels 1, 2 and the castor assemblies 5 manually operable is that they do not need any power supply and can therefore be adjusted wherever the bed is positioned in a hospital or other care environment. It may be desirable or necessary, for example, to park the bed in a waiting zone in which a power supply may not be immediately available. Similarly, it may be desired or necessary to get a patient onto or off the bed in any of a multitude of circumstances and again where a power supply may not be available. Whilst an on-board power supply, typically a battery, may be feasible in some cases, this does not provide a guarantee of reliable operation of the safety devices, particularly given the power such devices can consume.

Referring now to FIGS. 2 to 6, there is shown a preferred embodiment of castor and brake assembly 4, 5 for the bed of FIG. 1, which incorporates a sensor unit for determining the state of operation of the brake actuator 4 and thus of whether the castor 5 is locked or free to rotate.

Figure 2:
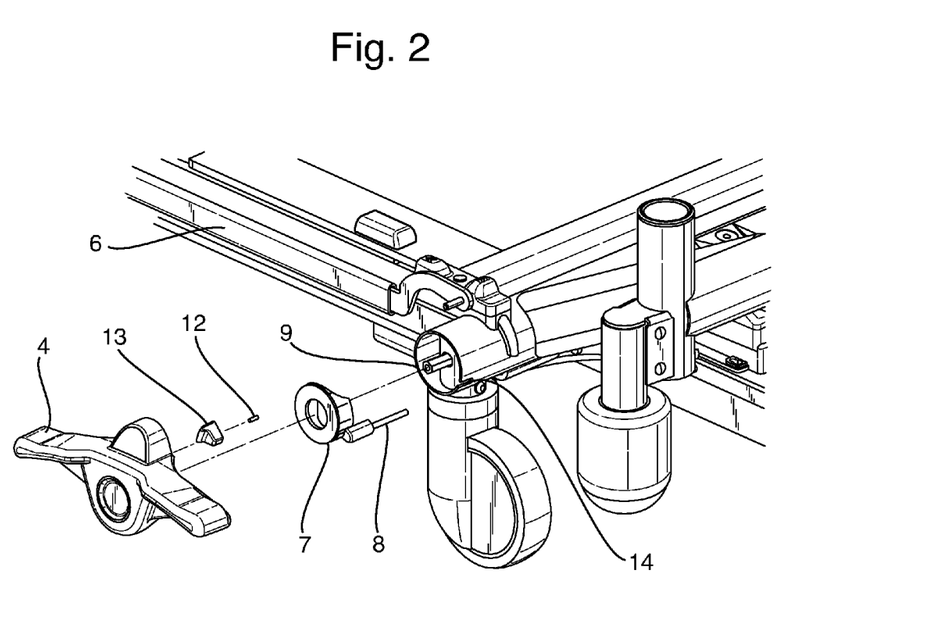
FIG. 2 in an exploded view showing a complete brake sensor, brake pedal, activating magnet, and magnet holder of a preferred embodiment of bed safety device.
Figure 3:
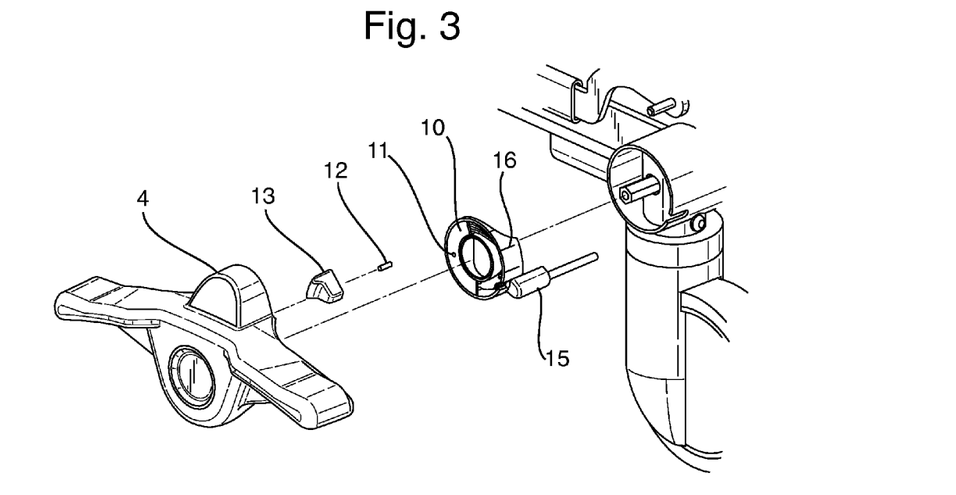
FIG. 3 is an exploded view showing the brake sensor with cover removed, brake pedal, activating magnet, and magnet holder of the embodiment of FIG. 2.
Figure 4:
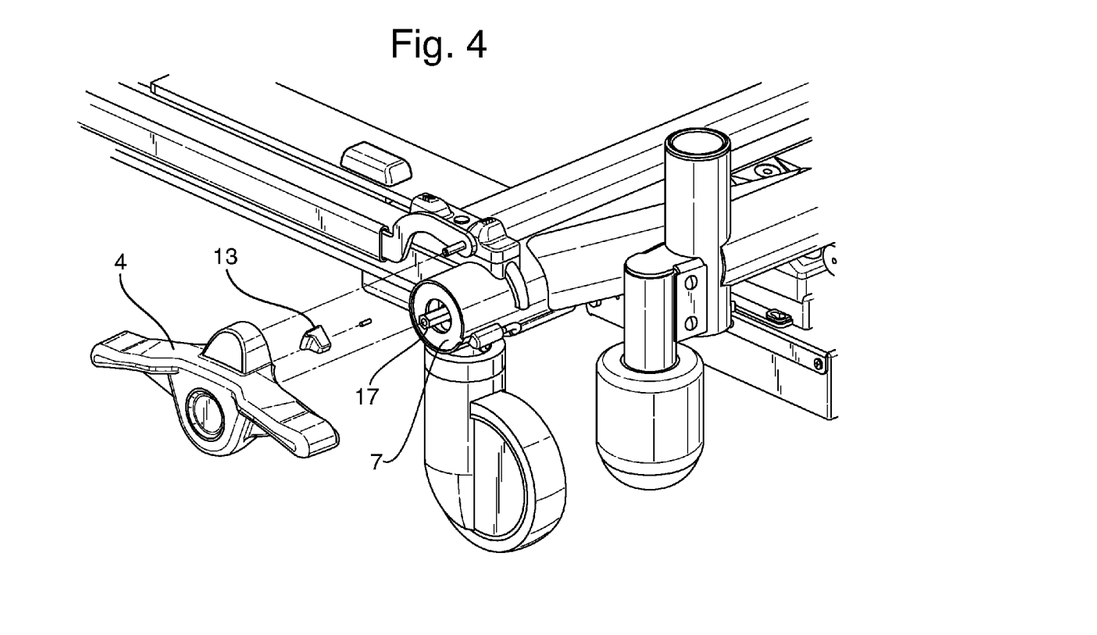
FIG. 4 in an exploded view showing the brake sensor located inside a base cross-member, brake pedal, activating magnet, and magnet holder of the embodiment of FIG. 2.

The assembly includes a moulded clam shell housing 7 containing a printed circuit board (PCB) 10 on which is mounted a Hall-effect switch 11 and other associated electronic components. An electrical cable 8 is fitted to the sensor to provide power and communicate with a bed monitoring or control system (not shown). An over-moulded grommet 15 is attached to the cable which creates a seal for the cable entry into the housing and provides a degree of flex-protection. The grommet also locates into a slot 14 in the base cross-member 9, thereby fixing the sensor radially. Splines 16 are moulded onto the side-wall of the housing 7 to provide a snug fit with the bore of the base cross-member 9.

Figure 5:
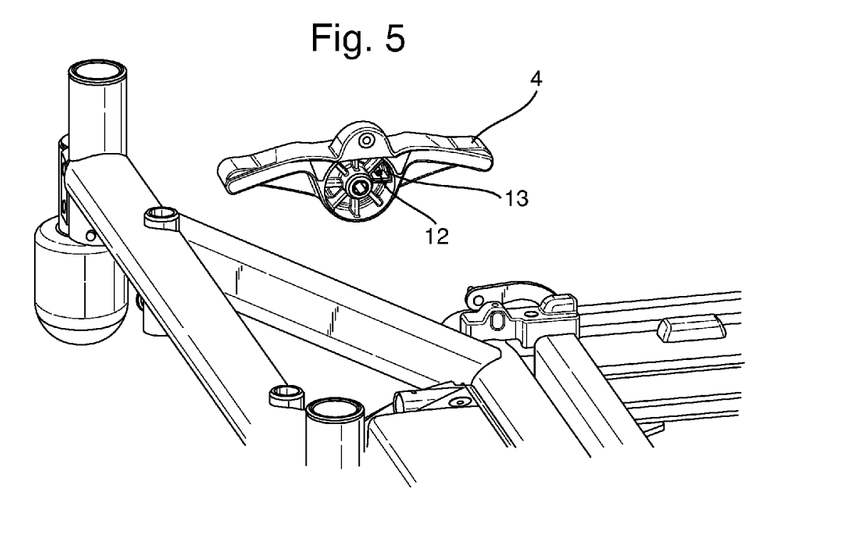
FIG. 5 is an exploded view showing the magnet holder located inside the brake pedal of the embodiment of FIG. 2.
Figures 6A, 6B:
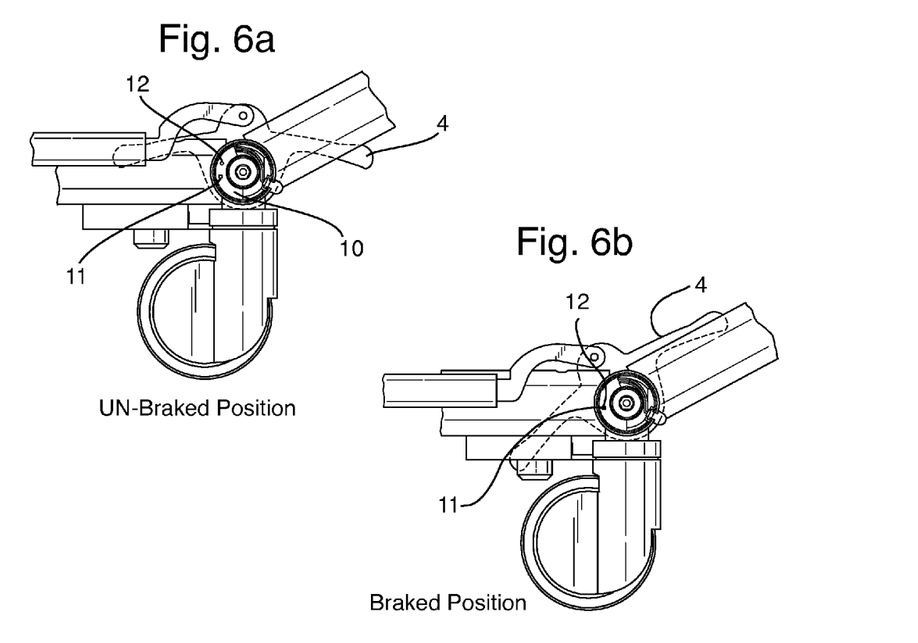
FIG. 6a shows the relative position of the activating magnet and Hall-effect switch in an un-braked position.
FIG. 6b shows the relative position of the activating magnet and Hall-effect switch in a braked position wherein the magnet and switch are in line with each other.
Figure 7:
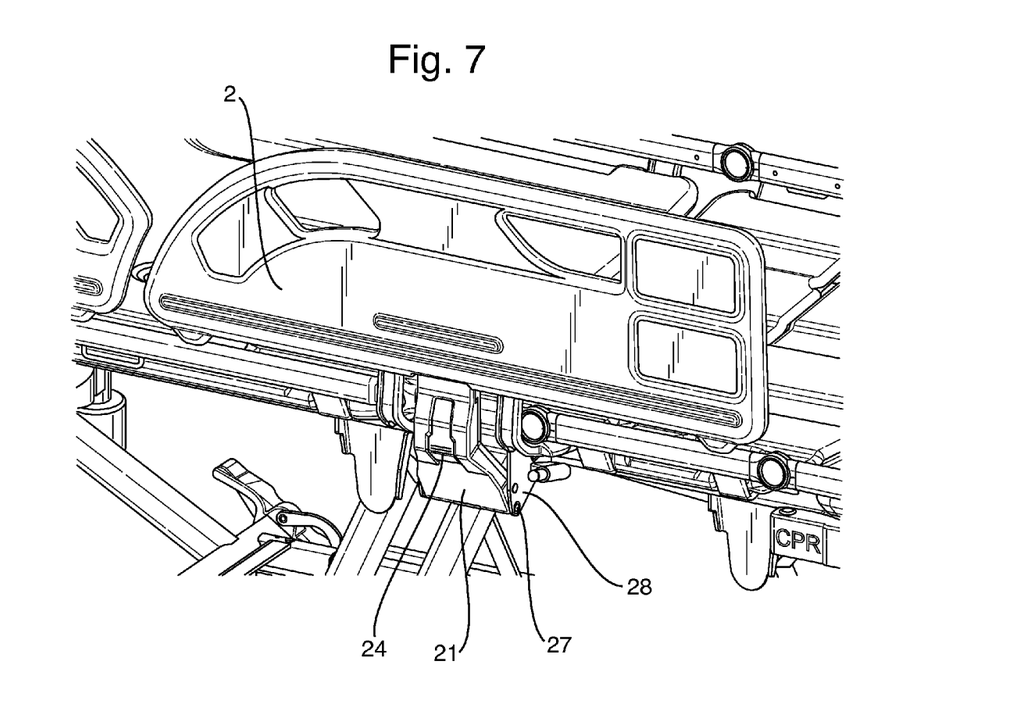
FIG. 7 shows a general arrangement of a bed safety-side according to another embodiment of the present invention.

A magnet 12 is fitted to a magnet holder 13 which in turn is fitted to brake pedal or actuator 4. In another embodiment, the magnet could be fitted directly to the pedal by provision of a suitable recess.

Operation of the sensor is a simple process. When the brake pedal 4 is in the "un-braked" or released position (see FIG. 6a), the magnet is positioned sufficiently far enough away from the Hall-effect switch to not activate it. When the pedal is in the "braked" or locking position (see FIG. 6b) the magnet is in line with the Hall-effect switch which is thus activated.

In the preferred embodiment of bed, all four brake pedals are linked by means of bars 17 and links 6, such that operation of any brake pedal will effect the same change to the other brake pedals and will be monitored by the same sensor 11 and thus requiring only a single sensor unit for all four castor assemblies. Other embodiments may have additional sensor units on other castor assemblies, for example as verification sensors and in which the monitoring or control unit will only determine correct actuation of the brakes when every sensor detects brake activation. Similarly, in cases where the castor assemblies are not mechanically linked to one another or linked in smaller sets, for example pairs, there is preferably provided a sensor unit per castor assembly or per set.

As the Hall effect switch is a non-mechanical electronic device the sensor is inherently reliable.

Referring now to FIGS. 7 to 12, there is shown the preferred embodiment of hinge assembly for the side panels 1 and 2. As the side panels 1 and 2 are typically independently movable, a sensor system is advantageously provided in each hinge assembly.

Figure 12:
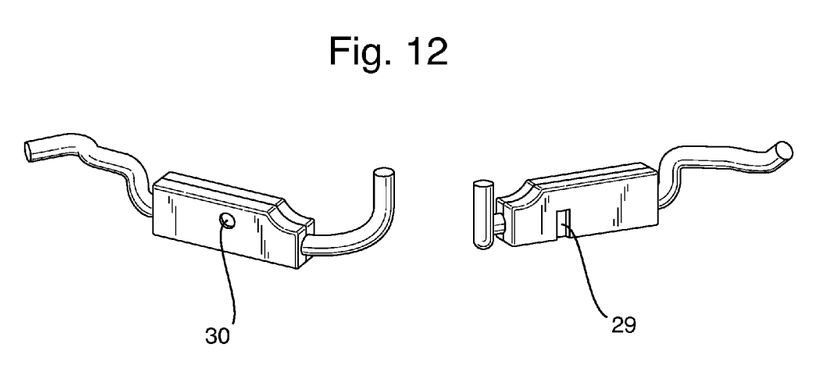
FIG. 12 shows back and front views of the sensor of the embodiment of FIG. 7.

The preferred embodiment of safety side sensor unit includes an over-moulded casing 22 disposed over a printed circuit board (PCB) 26 on which is mounted a Hall-effect switch 25 and other associated electronic components. An electrical cable 20 is fitted to the PCB to provide power and communicate with the bed monitoring or control system. The sensor is fitted into the safety-side panel assembly 3 and locates by means of a groove 29 in the casing which fits over as rib in the arm casting 21. A local thinning of the casing 30 is located over the Hall-effect switch 25 so as not to decrease its sensitivity unnecessarily. An activating magnet 18 is fitted into a hole in the plunger actuator 17.

Figure 9:
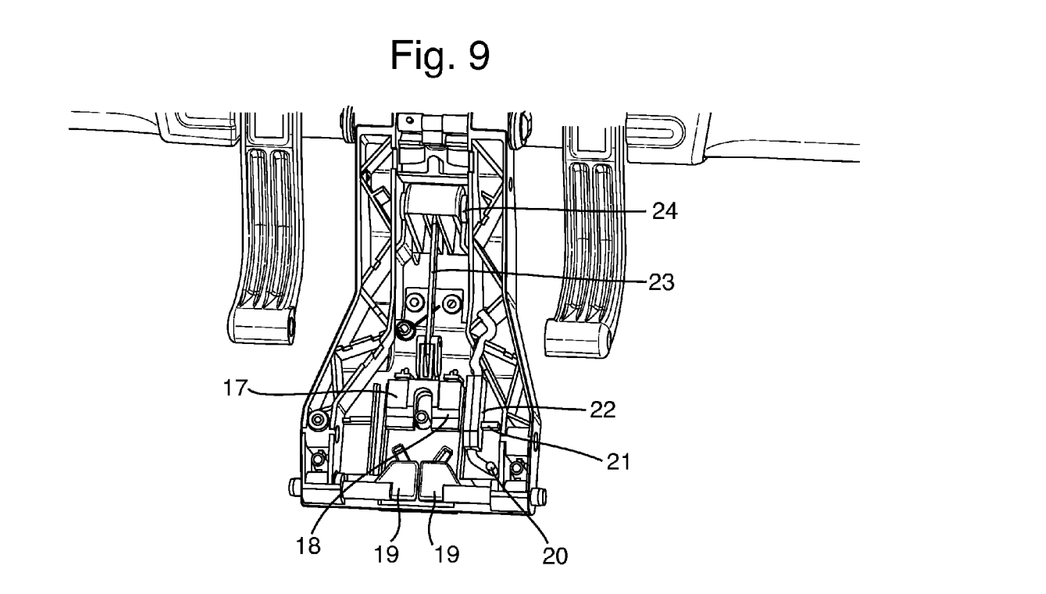
FIG. 9 is a view of the internal components of the safety-side arm with locking plungers in the un-locked position, of the embodiment of FIG. 7.
Figure 11:
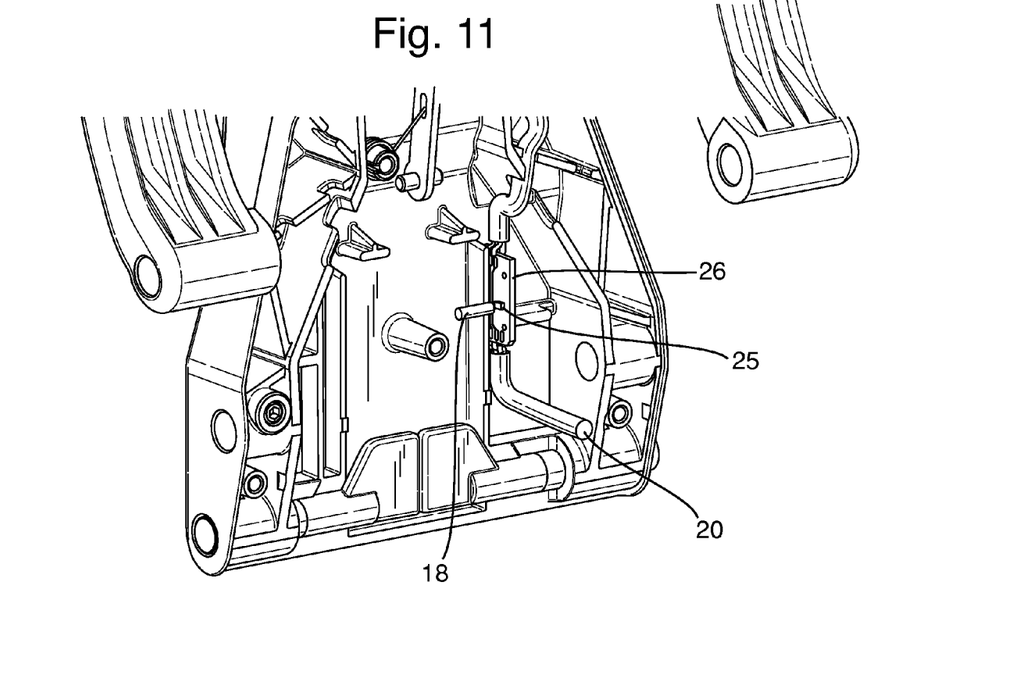
FIG. 11 is a view of the internal components of the safety-side arm with sensor case and plunger actuator removed to show relative positions of activating magnet and Hall-effect switch when in un-locked position.

In order to lower the safety-side 2, the release lever 24 is manually pulled outwards, causing the link 23 to slide the plunger actuator 17 upwards, which in turn disengages the plungers 19 from the holes 27 in the mounting bracket 28. This also positions the activating magnet 18 in line with the Hall-effect switch 25, thereby indicating to the bed-monitoring system that the safety-side is unlocked. Once the plungers are disengaged and the safety-side 2 is free to move, the operator can let go of the release lever 24 and the side 2 lowered.

Figure 8:
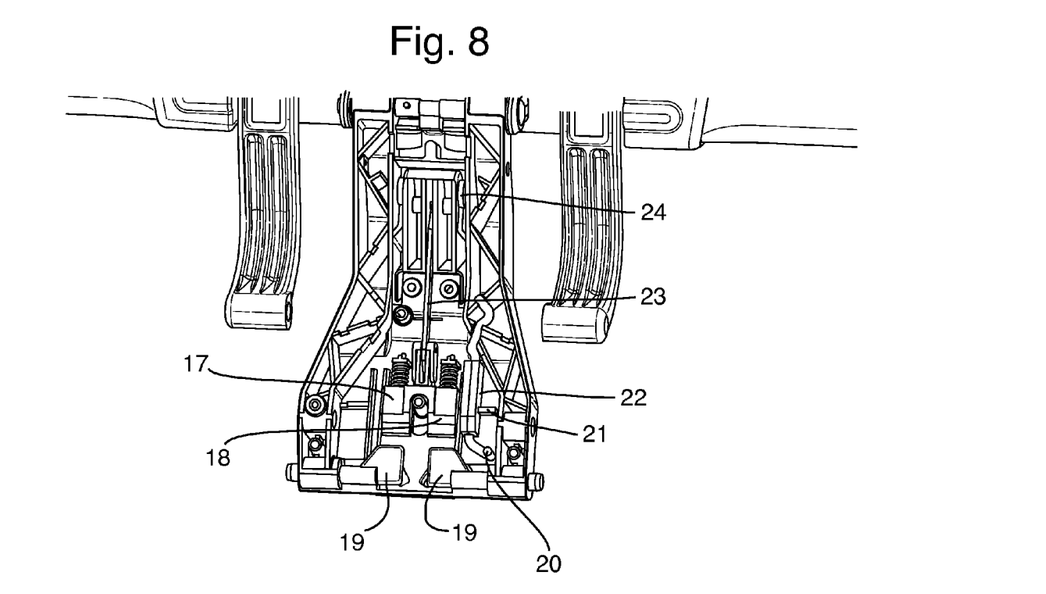
FIG. 8 is a view of internal components of the safety-side arm with locking plungers in the locked position, of the embodiment of FIG. 7.
Figure 10:
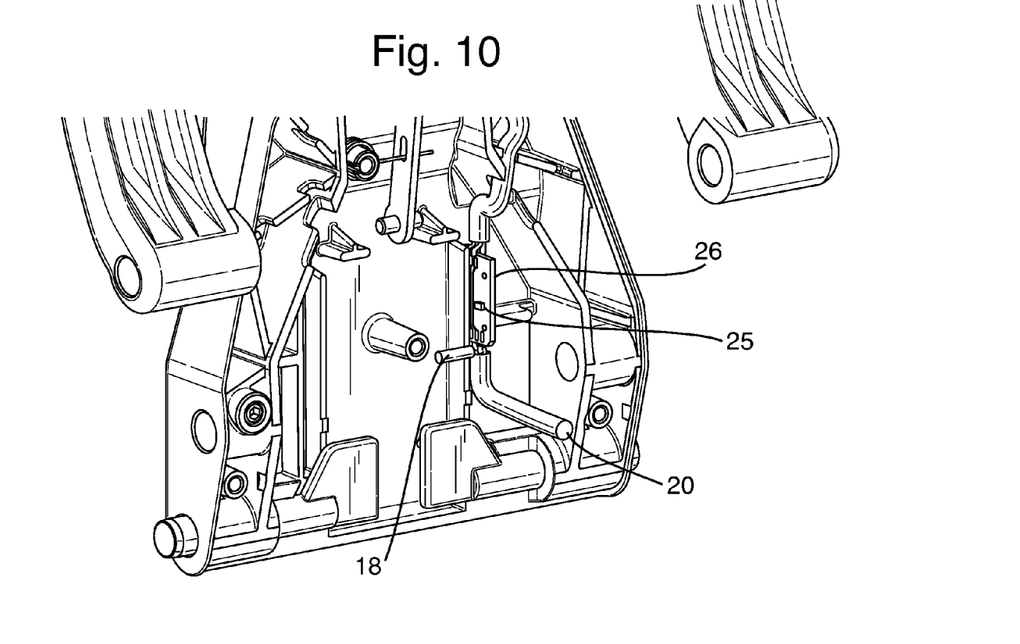
FIG. 10 is a view of the internal components of the safety-side arm with sensor case and plunger actuator removed to show relative positions of activating magnet and Hall-effect switch when in locked position, of the embodiment of FIG. 7.

When the safety-side 2 is raised again, the plungers 19 automatically engage into the holes 27 in the mounting bracket 28. This allows the plunger actuator 17 to move downwardly and so re-position the activating magnet 18 away from the Hall-effect switch 25, thereby so indicating to the bed-monitoring system that the safety-side is locked.

The plunger actuator 17 is always held in the up position unless both the plungers are fully engaged. This means that a partial engagement of the plunger/plungers 19 would indicate to the bed-monitoring system that the safety-side is in an unsafe condition.

As with the castor brake sensor, the Hall effect switch is a non-mechanical electronic device so the sensor is inherently reliable.

The monitoring or control system could be based on commonplace components, including a processor and a memory. In the preferred embodiment, the system also includes a recording capability, a clock and an output unit for outputting historical data relating to the operation of the safety device or devices. It is envisaged that the output unit could be a printer or an output port for coupling to a computer or printer, so as to provide the care facility with the stored record. The record can thus give data as to when the safety features were active and not active, which can be correlated with a patient's movement on the bed over that period. This will enable verification of the state of the bed in case of dispute as to whether the bed had been properly set during a patient's stay thereon.

It is to be appreciated that specific embodiments are described above which include specific details not essential to the performance of the inventive features taught herein and which could therefore be modified, replaced or omitted without detriment to the advantageous characteristics of the inventive features.

It will also be appreciate that although the castor and side panel assemblies taught herein are the preferred implementations of the invention taught herein, the teachings herein could be applied to other manually operable safety devices.

The sensor units disclosed herein could be arranged to trigger either when the safety feature is in a locked condition or in an unlocked condition, depending on design choice. The result is the same, with the monitoring or control unit monitoring either for a trigger signal indicative of a locked condition or a trigger signal indicative of an unlocked condition.

A Hall-effect sensor system is preferred for its simplicity and reliability. However, other sensor systems could be used, including for example an optical system. It is preferred that the sensor includes no moving parts for reliability, in which any moving trigger element, magnet or mirror for example, is integral with the manual actuator used to lock or unlock the safety device.

Other embodiments will be apparent to the skilled person having regard for the teachings herein and the claims which follow.

The invention claimed is:

1. A manually operable wheel lock safety device for a bed comprising:
   a lock for locking at least one or more wheels of a bed;
   a user engagable manually operable actuator coupled to a wheel unit and forming part of a brake assembly, wherein the actuator locks or releases the lock to allow rotation and translational movement of the at least one or more wheels; and
   a sensor unit at least in part directly coupled to the actuator and operable to detect whether the actuator is in a locking or releasing condition, the sensor unit comprising:
      a trigger element; and
      a sensor element operatively associated with and positionable adjacent to the trigger element, wherein one of the trigger and sensor elements is mounted directly to the actuator and its position relative to the other trigger and sensor element is able to indicate a locked or unlocked state of the one or more wheels, wherein the sensor element is mounted to a housing of the wheel unit and wherein the actuator is directly and rotationally coupled to the housing to rotationally align the trigger element and the sensor element.

2. A manually operable wheel lock safety device for a bed comprising:
   a lock for locking at least one or more wheels of a bed;
   a user engagable manually operable actuator coupled to a wheel unit and forming part of a brake assembly, wherein the actuator locks or releases the lock to allow rotation and translational movement of the at least one or more wheels; and
   a sensor unit fitted at least in part to the actuator and operable to detect whether the actuator is in a locking or releasing condition, the sensor unit comprising:
      a trigger element; and
      a sensor element operatively associated with and positionable adjacent to the trigger element, wherein one of the trigger and sensor elements is mounted directly to the actuator and its position relative to the other trigger and sensor element is able to indicate a locked or unlocked state of the one or more wheels, wherein the sensor element is radially fixed to the wheel unit and wherein operation of the actuator causes rotational movement and alignment of the trigger element relative to the sensor element.

3. A manually operable bed safety device for a hospital bed comprising:
   a lock for securing a movable bed part and arranged to lock the device in a safety position;
   a manually operable actuator for releasing the lock and thereby releasing the safety device, wherein the actuator comprises an actuator plunger connectable to the lock; and
   a sensor unit fitted at least in part to the actuator and operable to detect whether the actuator is in a locking or a releasing condition, the sensor unit comprising:
      a trigger element; and
      a sensor element operatively associated with the trigger element, wherein one of the trigger and sensor elements is mounted directly to the actuator and its positioning relative to the other trigger and sensor element indicates a state of the lock,
   wherein operation of the actuator induces the actuator plunger and the sensor or trigger element mounted thereto to slide upwards, aligning with the other sensor or trigger element and inducing movement of the lock.

4. A manually operable bed safety device according to claim 3, wherein the manually operable bed safety device is a castor assembly including a wheel unit fittable to a bed frame and provided with a castor, the lock being a brake mounted on the castor assembly and movable between a release position allowing rotation of the castor and a locking position preventing rotation of the castor; the manually operable actuator being coupled to the brake and operable to move the brake between the release and locking positions; the sensor unit being provided with a trigger element and a sensor element, the trigger element being located on the manually operable brake actuator and the sensor device being located on the wheel unit.

5. A manually operable bed safety device according to claim 3, wherein the sensor element includes no movable parts.

6. A manually operable bed safety device according to claim 3, wherein the trigger element is a magnet and the sensor element is a Hall-type sensor.

7. A monitoring apparatus for monitoring the manually operable bed safety device according to claim 3, including a control unit coupled to the sensor unit and an indicator unit controllable by the control unit and operable to give an indication of the state of the manually operable bed safety device.

8. The monitoring apparatus according to claim 7, wherein the control unit includes a memory and a clock and is configured to store data relating to the state of the manually operable bed safety device over a period of time.

9. The monitoring apparatus according to claim 8, including a report generating unit operable to provide a report of the data stored in memory.

10. The monitoring apparatus according to claim 9, wherein the report generating unit includes an output device for outputting said data.

11. The monitoring apparatus according to claim 7, wherein the control unit is configured to receive data from a plurality of sensor units of a plurality of associated manually operable bed safety devices and to give an indication of the state of the plurality of associated manually operable bed safety devices.

12. The monitoring apparatus of claim 11, wherein the control unit is configured to give an indication of the state of all of the plurality of manually operable bed safety devices.

13. The monitoring apparatus of claim 11, wherein the control unit is configured to give an indication of the state of all of the plurality of manually operable bed safety devices.

14. A manually operable safety side panel assembly for a hospital bed, the safety side panel assembly comprising:
 a panel element;
 a hinge assembly coupled to the panel element and attachable to a bed frame, wherein the hinge assembly allows movement of the panel element between a safety position and a access position for a hospital bed:
 a lock for securing a movable bed part and arranged to lock the safety side panel assembly in a safety position, wherein the lock comprises one or more locking plungers;
 a manually operable actuator for releasing the lock and thereby releasing the safety side panel assembly, wherein operation of the actuator induces the one or more locking plungers to disengage with a fixed mounting bracket of the bed and unlock the safety side panel assembly; and
 a sensor unit fitted at least in part to the actuator and operable to detect whether the actuator is in a locking or a releasing condition, the sensor unit comprising:
  a trigger element; and
  a sensor element operatively associated with the trigger element, wherein one of the trigger and sensor elements is mounted directly to the actuator and its positioning relative to the other trigger and sensor element indicates a state of the lock.

15. A manually operable bed safety device for a hospital bed, wherein the safety device comprises:
 a lock arranged to lock the safety device in a safety position;
 a manually operable actuator for releasing the lock and thereby releasing the safety device; and
 a sensor unit fitted at least in part to the actuator and operable to detect whether the actuator is in a locking or a releasing condition;
 wherein the safety device is a safety side panel assembly for a hospital bed comprising a panel element and a hinge assembly coupled to the panel element and attachable to a bed frame, the hinge assembly permits movement of the panel element between a safety position and an access position;
 wherein the lock is coupled to the hinge assembly for locking the hinge assembly and thereby the panel element in the safety position; and
 wherein the manually operable actuator is located on the panel element and connected to the lock, wherein the sensor unit comprises a trigger element and a sensor element, the trigger element being located on the manually operable actuator and the sensor element being located on a part of the panel element or hinge assembly.

16. A manually operable bed safety device according to claim 15, wherein the sensor element includes no movable parts.

17. A manually operable bed safety device according to claim 15, wherein the trigger element is a magnet and the sensor element is a Hall-type sensor.

18. A manually operable bed safety device according to claim 15, wherein the actuator comprises a actuator plunger connected to the lock, wherein operation of the actuator induces the actuator plunger and the trigger element to slide upwards, aligning with the other sensor element and inducing movement of the lock.

* * * * *

UNITED STATES PATENT AND TRADEMARK OFFICE
CERTIFICATE OF CORRECTION

PATENT NO.        : 9,724,255 B2
APPLICATION NO.   : 14/415575
DATED             : August 8, 2017
INVENTOR(S)       : Stephen Hollyoak et al.

It is certified that error appears in the above-identified patent and that said Letters Patent is hereby corrected as shown below:

In the Claims

Column 8, Line 45, Claim 18, after "the" delete "other"

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*